United States Patent [19]
Descamps

[11] Patent Number: 5,447,745
[45] Date of Patent: Sep. 5, 1995

[54] METHOD OF SEALING

[75] Inventor: Pierre Descamps, Rixensart, Belgium

[73] Assignee: Dow Corning S.A., Seneffe, Belgium

[21] Appl. No.: 323,947

[22] Filed: Oct. 17, 1994

[30] Foreign Application Priority Data

Oct. 19, 1993 [GB] United Kingdom ............... 9321502

[51] Int. Cl.$^6$ .............................................. B05D 3/02
[52] U.S. Cl. ................................. 427/8; 427/327; 427/387; 427/388.2
[58] Field of Search ................ 427/8, 327, 387, 388.2

[56] References Cited

U.S. PATENT DOCUMENTS 4,261,758 4/1981 Wright et al. ................. 427/387 X
4,797,446 1/1989 Dietleir et al. ................. 437/387 X

FOREIGN PATENT DOCUMENTS 0058023 8/1982 European Pat. Off.
1247882 10/1960 France.
9118257 11/1995 WIPO.

OTHER PUBLICATIONS

Klein, I. E. et al., "An Electrical Equivalent for Barrier Anodic Films on Aluminium", Electrochimica Acta, vol. 17, 1972, pp. 2231–2237.
Kiyohara, K. et al., "Determination of Capacitances and Conductances of the Constituent Phases from Dielectric Observations on Terlamellar Composite Systems", Japanese Journal of Applied Physics, vol. 29, No. 9, Sep. 1990, pp. 1751–1756.
Database Inspec, Institute of Electrical Engineers, Stevenage, GB Inspec No. 3244372, Debuyck et al. 'Estimating the Barrier Layer Thickness of Porous Aluminium Oxide Films . . . ' & Surface and Coatings Technology, vol. 34, No. 3, 1988, Switzerland, pp. 311–318 (Abstract).

*Primary Examiner*—Michael Lusignan
*Attorney, Agent, or Firm*—Roger H. Borrousch

[57] ABSTRACT

The specification describes and claims a method of bonding a sealant to an anodised aluminium surface the method comprising the steps of (1) measuring the electrical impedance of anodised aluminium substrates, (2) selecting at least one substrate having an electrical phase shift of from 0.4 to 0.5, (3) cleaning the anodised surface of the substrate, (4) applying to the anodised surface a curable silicone sealant composition and (5) bringing about curing of the sealant composition to form a bond between the anodised surface and the sealant.

4 Claims, 3 Drawing Sheets

METHOD OF SEALING

This invention is concerned with a method of sealing.

Anodised aluminium is a material used for many purposes. It is made by connecting aluminium as the anode in an electrolytic bath of ionised water with a nickel cathode. During electrolysis a film of aluminium oxide builds on the aluminium. The film generally contains a regular pattern of pores or pits having a hemispherical portion and a greater or lesser cylindrical wall. The material may be subjected to a colouring operation in which a colorant or reflectant is deposited in the pits. Subsequently the aluminium so treated is subjected to a treatment to produce a layer of crystalline monohydrate on the aluminium oxide film, which enters the pores and overcoats the film. The precise materials and procedures employed to produce the anodised aluminium govern the thickness and mutual adhesion of the layers to the aluminium and generally determines the surface characteristics of the product.

Anodised aluminium is frequently used in buildings, for example in the construction of windows and in surface cladding. It is one practice to bond or seal glass to aluminium by adhesive techniques. In some applications the extent to which the pores are filled, and thus the nature of the surface of the anodised aluminium, is of critical interest with regard to adhesion of adhesives and sealants thereto and the durability of adhesive bonds to the aluminium. Various techniques are available for preparing anodised aluminium to accept adhesives and sealants, but the most appropriate one to use is determined by the nature of the surface to be treated. Techniques are known for determining the characteristics of surfaces but we have found them unsuitable for simple and rapid determination of detailed information about surface characteristics for various reasons. Thus, determination of porosity of an anodised aluminium surface by measuring the darkness of the trace left by a drop of colouring matter laid on the surface is not appropriate for coloured aluminium; prolonged immersion of the anodised aluminium in a sulphuric acid bath, followed by determination of the weight loss of the aluminium, requires 20 hours immersion and in any event gives a poor guide because the degree of porosity of the surface is not directly proportional to the weight loss; the test method under ISO 2931 based on analogy between the anodised aluminium layer and an equivalent electrical circuit, results in the measured quantity (the admittance at a frequency of 1000 Hz) being dependent, not only on the porosity of the surface, but also on the thickness of the layer and on the nature of any pigment present so that the surface porosity cannot be readily determined directly and, furthermore, results achieved are generally so widely dispersed that aluminium producers allocate small credit to the results of such measurements. ISO 2933 standard is based on an electrical measurement of the impedance of the anodised layer but at a single frequency and, moreover, does not give satisfactory results with coloured anodised aluminium. The use of a single frequency enables access to information which is a complex combination of data about surface properties, for example thickness of the layer and degree of solvent or pigment if present.

It has been found that one may determine the porosity of a surface of anodised aluminium comprising various layers by use of an electrical procedure based on the analogy that each layer of an electrically conductive material such as anodised aluminium has a capacitance and or resistance specific to the layer which is dependent upon its thickness and composition and which may be resolved by measuring the electrical impedance of the material over a range of frequencies and that one may use the results as a basis for selection of suitable anodised aluminium substrates.

The procedure is a process for determining characteristics of a substrate comprising two or more layers of different electrical capacitance which comprises passing alternating current at several frequencies across the substrate, measuring the electrical impedance at each frequency and using the information to solve equations $$Re(y) = \frac{a + bw^2 + cw^4}{1 + dw^2 + ew^4} \quad (1)$$

and $$Im(y) = \frac{s + uw^2 + vw^4}{1 + dw^2 + ew^4} \quad (2)$$

where y is the complex admittance of the substrate, w is the frequency of the measured frequency, a, b, c, d are non-linear combinations of electrical resistances analogous to each of four layers of the substrate and s, e, u, v are non-linear combinations of electrical capacitances analogous to each of four layers of the substrate.

As for the ISO 2931 method, the procedure just above referred to is based on the analogy between the anodised aluminium layer and an electrical circuit. Instead of measuring the modulus of the complex admittance at fixed frequency, which quantity is a very complicated combination of different parameters of anodisation, the complex admittance is measured during a sweep in frequency. It has been demonstrated that each element of the equivalent electrical circuit can be determined independently which enables full characterisation of the surface properties (e.g. sealing of the pores, pores thickness, thickness of layer) of an anodised aluminium layer. Manipulation of the data may be carried out by a computer organised to process data automatically to determine the surface properties.

The procedure may be used to measure the impedance over a large frequency range of the surface of a layer of anodised aluminium in order to estimate the quality of the sealing of the pores at the surface of the layer and this may be done independently of the layer thickness. The degree of sealing can be estimated on coloured aluminium independently of the type of pigment used. Also, the thickness of the surface layer may be determined without any additional measurement. In its most sophisticated form a device using the procedure may be employed to determine surface quality of aluminium profiles at the stages of production of the anodised aluminium or of quality control of aluminium panels or profiles at the time of use.

A parameter, easy to measure with a single working frequency device, has been identified which is only dependant on the sealing quality and on the layer thickness. The layer thickness can be measured independently using a Foucault current measurement device. Based on that result a low cost, portable, pocket apparatus can be provided which enables measuring of the degree of sealing on coloured and non-coloured aluminium substrates. In this modification of the procedure (i) thickness of one layer of the substrate is measured independently and (ii) alternating current is passed across the substrate at a single high frequency and the information is used to solve equation (2) for a frequency (omega) which tends to infinity.

The electrical testing procedure allows the derivation of the electrical phase shift of an anodised aluminium surface which electrical phase shift can be used to determine the degree of surface sealing of the anodised surface. Further, the quality of adhesion of a silicone sealant to an anodised aluminium surface is dependent on the characteristics of the anodised surface, especially the degree of sealing of the anodised layer. Optimum adhesion of sealants to an anodised surface will be observed for a certain degree of surface sealing. Therefore, the electrical testing procedure aforesaid may be used to select those anodised aluminium surfaces which are likely to demonstrate required quality of adhesion of silicone sealant thereto.

The invention provides in one of its aspects a method of bonding a sealant to an anodised aluminium surface the method comprising the steps of (1) measuring the electrical impedance of anodised aluminium substrates, (2) selecting at least one substrate having an electrical phase shift of from 0.4 to 0.5, (3) cleaning the anodised surface of the substrate, (4) applying to the anodised surface a curable silicone sealant composition and (5) bringing about curing of the sealant composition to form a bond between the anodised surface and the sealant.

A method according to the invention can be used to bond together two substrates. The first substrate is an anodised aluminium substrate as hereinabove described. The second substrate may be chosen from those substrates capable of forming a bond with a silicone sealant composition. The preferred second substrate is glass. A bond between the two substrates may be formed in any convenient manner. For example, a silicone sealant composition may be applied to one or other of the substrates before bringing the second substrate into bonding contact with the first. Alternatively the substrates may be brought together before applying a sealant composition between the opposing substrate surfaces.

In a method according to the invention the silicone sealant composition may be any silicone elastomer forming composition and is preferably one which is capable of conversion to an elastomer at or about ambient temperature i.e. 20° to 25° C. and suitable for structural glazing purposes. Examples of such elastomer forming compositions comprise (A) an organosilicon polymer having silanol groups, (B) a silane or siloxane having at least three silicon-bonded alkoxy groups, (C) an adhesion promoter and (D) a condensation catalyst. If desired the elastomer forming composition may contain fillers and other ingredients such as pigments.

There follows a description, to be read with the accompanying drawings, of a testing procedure and of a sealing method provided by the invention and illustrative thereof.

Figure 1:
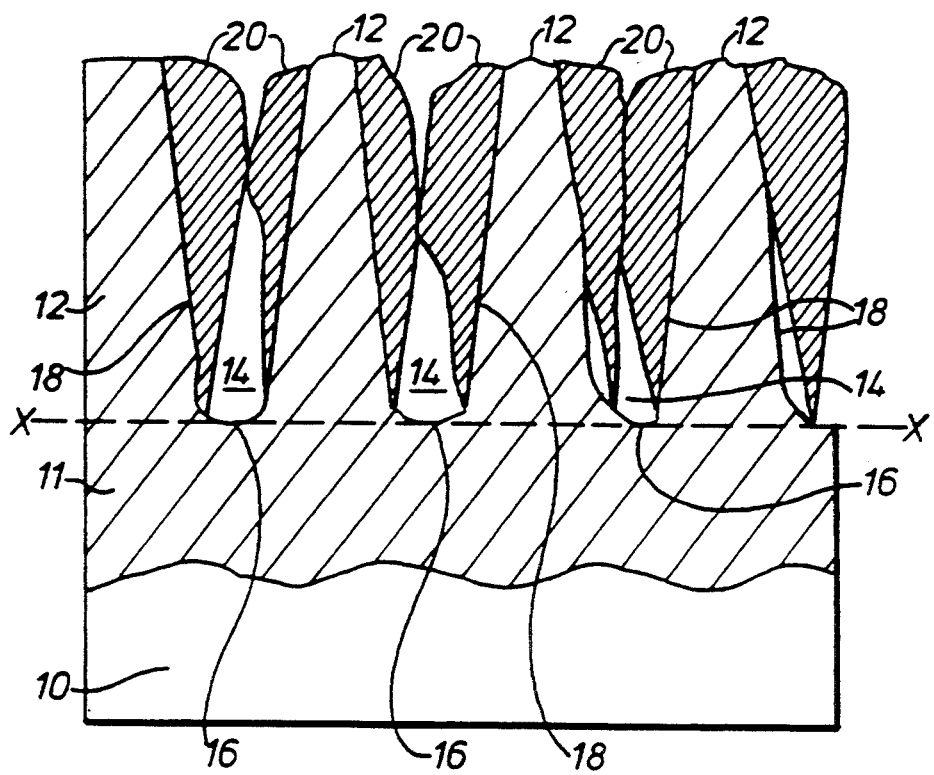
FIG. 1 is a diagrammatic section through a piece of anodised aluminium.

The piece of anodised aluminium shown in FIG. 1 comprises a body of aluminium (10) and a film of aluminium oxide adherent thereto and comprising a homogenous layer (11) demarcated by the line x—x in FIG. 1 and a series of "pillars" (12) upstanding therefrom. The pillars (12) are distributed in a regular pattern and define a series of pores (14) having a hemispherical end surface portion (16) and a cylindrical wall (18). Within the pores a layer (20) 10 of crystalline monohydrate is present on the aluminium oxide film.

Figure 2:
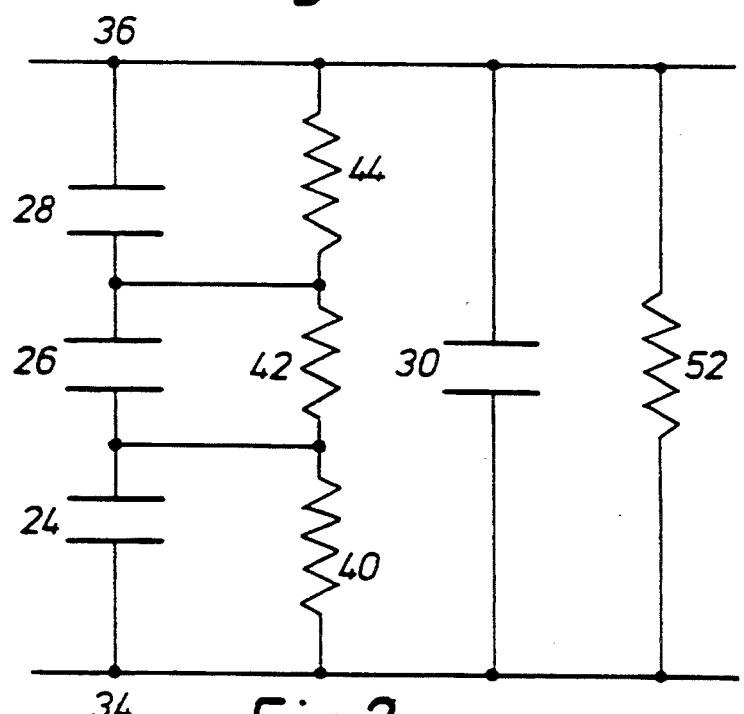
FIG. 2 is a circuit diagram of an electrical circuit analogous to the section shown in FIG. 1.

The circuit shown diagrammatically in FIG. 2 comprises a plurality of capacitors (24, 26, 28, 30) having capacitances $C_3$, $C_2$, $C_1$ and $C_0$ respectively. The capacitors (24, 26, 28) are connected to each other in series. Each corresponds to the electrical capacitance of one of the layers, the capacitor (24) corresponding to the homogenous aluminium oxide layer (11), the capacitors (26) and (28) reflect the degree of sealing of the pores. These capacitors are connected to each other in series and are connected to an input conductor (34) and an output conductor (36). The capacitor (30) has a capacitance $C_O$ and corresponds to the electrical capacitance of the homogenous aluminium oxide layer (11) plus the pillars (12) as a whole and is connected between the input and output conductors (34, 36) in parallel with the capacitors (24, 26, 28). Adjacent the series of capacitors (24, 26, 28) is a series of resistors (40, 42, 44) having resistances $R_3$, $R_2$, $R_1$ respectively which are connected to each other in series between the input and output conductors (34, 36) and in parallel with the capacitors. These resistors are each dedicated to measure the electrical resistance of one of the layers (the resistance thereof being a function of the thickness thereof). The resistor (40) corresponds to the resistance of the basic aluminium oxide layer (11), the resistance (42) or (44) corresponds to the aluminium oxide monohydrate layer (20) or the contents (if any) of the pores (14). A resistor (52) having resistance $R_0$ is connected between the input and output conductors (34, 36) in parallel with the capacitor (30). This resistor (52) has an electrical resistance dedicated to measure the resistance of the layers 11 and 12 together.

In use of the illustrative process the Real (Re) and Imaginary (Im) part of the admittance are measured during a sweep in frequency. Electrical contact between a power source capable of delivering alternating current in a wide range of frequencies and the substrate is achieved for example by a mercury or aqueous sodium chloride contact placed on the upper surface of the substrate and a metal connector applied to the lower surface as described in ISO 2931.

The Re (y) and Im (y) dependance on the measuring frequency is $$Re(y) = \frac{a + bw^2 + cw^4}{1 + dw^2 + ew^4} \quad (1)$$

$$Im(y) = \frac{s + uw^2 + vw^4}{1 + dw^2 + ew^4} \quad (2)$$

where y is the complex admittance of the layer and w is the pulsation of the measuring signal.

By fitting equations (1) and (2) to the frequency evolution of the recorded admittance, one may determine values of a, b, c, d, e, s, u, v which are non-linear combinations of $R_0$, $R_1$, $R_2$, $R_3$, $C_0$, $C_1$, $C_2$, $C_3$ where $R_0$, $R_1$, $R_2$, $R_3$ are the values in Ohms of the resistances and $C_0$, $C_1$, $C_2$, $C_3$ are the capacitance values in Faraday of the capacitors.

Figure 3:
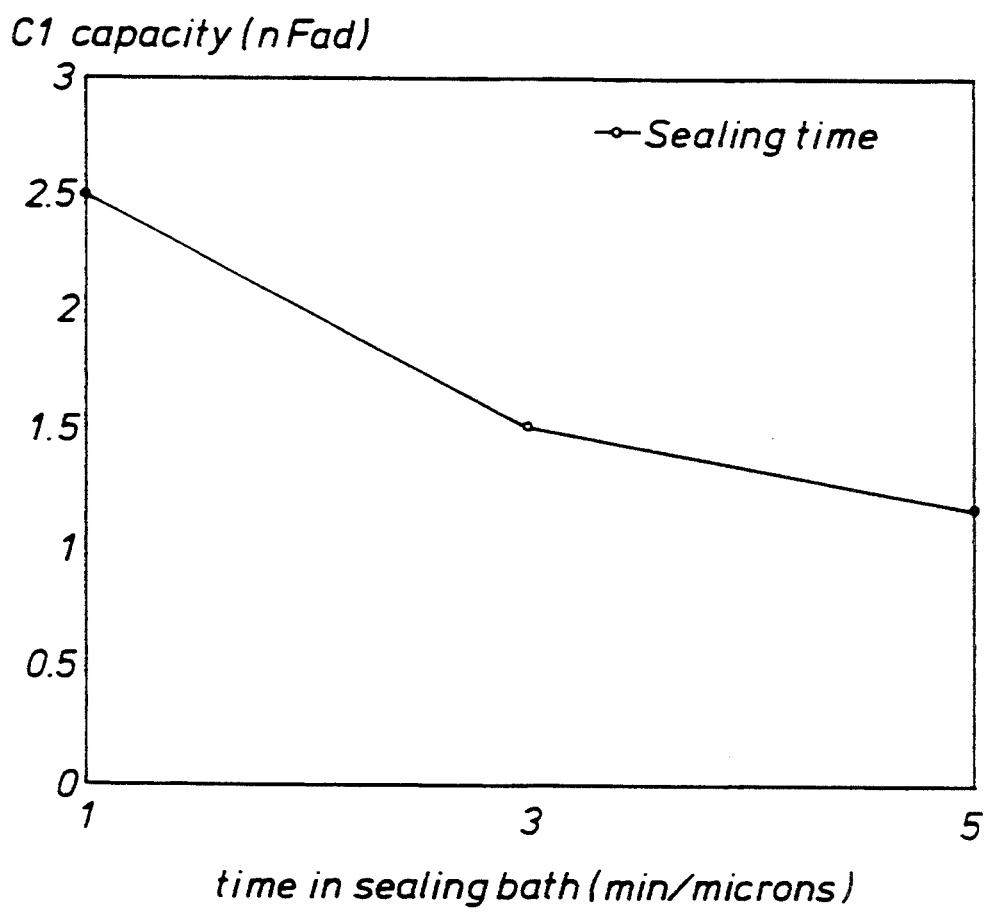
FIG. 3 is a plot of capacitance $C_1$ (reflecting the degree of sealing of the pores) versus the sealing time (minutes/micron)
Figure 4:
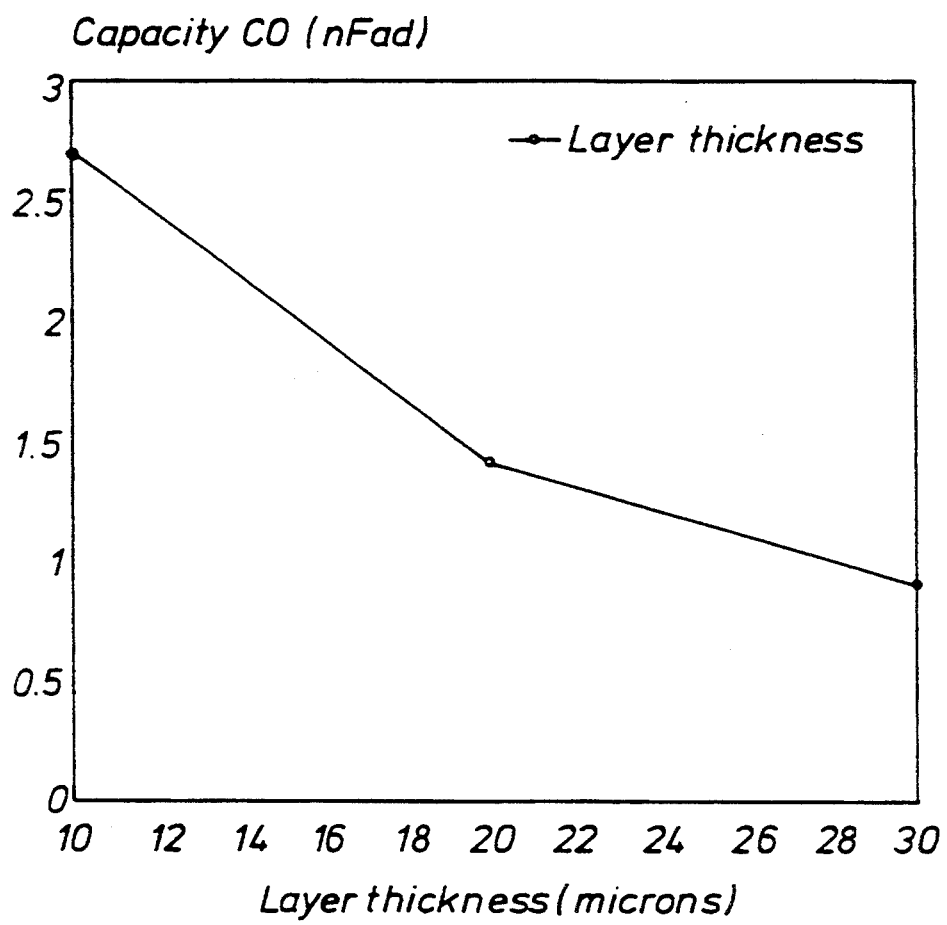
FIG. 4 is a plot of capacitance $C_O$ (reflecting the capacitance of the homogeneous layer) versus layer thickness (microns).

When solving the full system of equations, access to $C_1$ may be achieved by correlation of $C_1$ with the sealing level measured using a calibration technique wherein the capacitance is measured for a number of samples having a known degree of sealing (expressed as time spent in a sealing bath) the result of which is shown in FIG. 3. Access to $C_O$ may be achieve by correlation of $C_0$ with layer thickness measured with a Foucault current measurements device for which see FIG. 4. Thus one may, without any correction procedure deduce from measurement of the impedance as referred to above, the sealing degree, independently of the layer thickness and the thickness of the aluminium oxide layer.

By substituting in equations 1 and 2 Re (y) and Im (y) arising from the sweep measurement the equations may be solved for the eight quantities a, b, c, d, e, s, u, v, these quantities being non-linear combinations of the circuit parameters. By solving the homogeneous system of eight equations with eight unknowns using the Levemberg-Markart algorithm one can calculate $R_1$, $R_2$, $R_3$, $R_0$, $C_0$, $C_1$, $C_2$, $C_3$. It has been demonstrated that $R_1$, $C_1$ are mainly dependant on the sealing quality. Moreover, $C_O$ is directly dependant on the pores thickness. $C_1$ has been correlated to the sealing degree measured by the technique referred to above, not taking into account the layer thickness measured by the Foucault current method. Again, the expected dependance of $C_O$ on the layer thickness is observed.

When analysing the dependance of the measured quantities on the circuit parameters one observes that v/e is dependent only on the capacitor elements of the circuit $$v/e = C_0 + \frac{C_1\,C_2\,C_3}{C_1\,C_2 + C_1\,C_3 + C_2\,C_3}$$

v/e thus depends on the degree of sealing (parameters $C_1C_2$) and also on the layer thickness. If the thickness of the layer is known, this parameter can be used to estimate the sealing of the pores. v/e is correlated to the ISO 2143 measurements performed on non-coloured substrates. The correlation observed is far better than the one observed when using the ISO 2931 anotest measurement.

It has been demonstrated that v/e can be used to estimate the degree of sealing if the layer thickness is known. One can demonstrate that v/e is the asymptotic value of Im (y) when frequency tends to infinity. It has been observed that, at a frequency level equal to 20 kHz, Im (y) is nearly equal to v/e. By measuring Im (y) at a single, high frequency the degree of sealing of the layer can thus be estimated accurately.

A silicone sealant composition was formed by mixing together a silanol terminated polydimethylsiloxane having a viscosity of about 60,000 centistokes (39.5 parts), n-propylorthosilicate as a crosslinking agent (23.7 parts), dibutyltindilaurate (1.0 part), aminopropyltriethoxysilane as an adhesion promoter (19.8 parts) and carbon black (15.8 parts).

The electrical testing procedure as hereinabove described was used to determine the electrical impedance and thus derive the electrical phase shift of a number of anodised aluminium samples. The anodised samples were then cleaned by wiping with a siloxane cleaner. After allowing sufficient time for the samples to dry (about five minutes) a bead of the sealant composition was applied to the samples, a reinforcing wire mesh was placed on top of the sealant bead and a further bead of sealant composition was extruded over the reinforcing mesh. The sealant composition was allowed to cure for 14 days at ambient temperature before being immersed in 55° C. hot water for seven days and immediately afterwards sugjected to the ASTM C-794 peel adhesion test. Table I below correlates the quality of sealant adhesion with the electrical phase shift measurement of the samples. The quality of adhesion is expressed as the percentage of ASTM C-794 peel test samples resulting in cohesive failure mode versus the total number of samples in a given electrical phase shift class.

TABLE I

| | Electrical Phase Shift* | | | | | | | |
|---|---|---|---|---|---|---|---|---|
| | 0.1 | 0.2 | 0.3 | 0.4 | 0.5 | 0.6 | 0.7 | 0.8 |
| % Cohesive failure | 79 | 75 | 80 | 96 | 99 | 76 | 67 | 32 |

*Electrical phase shift class of 0.4 and 0.5 represents about 85% of all samples tested The results indicate that an electrical phase shift of from 0.4 to 0.5 results in a cohesive failure rate of close to 100%.

That which is claimed is:

1. A method of bonding a sealant to an anodised aluminium surface the method comprising the steps of (1) measuring the electrical impedance of anodised aluminium substrates, (2) selecting at least one substrate having an electrical phase shift of from 0.4 to 0.5, (3) cleaning the anodised surface of the substrate, (4) applying to the anodised surface a curable silicone sealant composition and (5) bringing about curing of the sealant composition to form a bond between the anodised surface and the sealant.

2. A method according to claim 1 wherein the electrical impedance is determined by a procedure which comprises passing alternating current at several frequencies across the substrate, measuring the electrical impedance at each frequency and using the information to solve equations $$Re(y) = \frac{a + bw^2 + cw^4}{1 + dw^2 + ew^4} \quad (1)$$

and $$Im(y) = \frac{s + uw^2 + vw^4}{1 + dw^2 + ew^4} \quad (2)$$

and
where y is the complex admittance of the substrate, w is the frequency of the measured frequency, a, b, c, d are non-linear combinations of electrical resistances analogous to each of four layers of the substrate and s, t, u, v are non-linear combinations of electrical capacitances analogous to the said four layers of the substrate.

3. A modification of the method according to claim 2 wherein (i) thickness of one layer of the substrate is measured independently and (ii) alternating current is passed across the substrate at a single high frequency and the information is used to solve equation (2) .

4. A method according to claim 1 wherein the silicone sealant composition is convertible to an elastomer at 20° to 25° C. and comprises a polymer having silanol groups, a silane or siloxane having at least three silicon-bonded alkoxy groups, an adhesion promoter and a condensation catalyst.

* * * * *